United States Patent
Like et al.

(10) Patent No.: US 10,090,654 B1
(45) Date of Patent: Oct. 2, 2018

(54) JUNCTION BOX ASSEMBLY WITH EYELET TERMINAL COVER RETENTION SYSTEM AND REMOVABLE EYELET TERMINAL COVER

(71) Applicant: Sumitomo Wiring Systems, Ltd., Yokkaichi-shi, Mie (JP)

(72) Inventors: Nathan Like, Farmington Hills, MI (US); Akihiro Maximilian Matsumura, Farmington Hills, MI (US); Aaron Mark Steffka, Farmington Hills, MI (US)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 0 days.

(21) Appl. No.: 15/639,387

(22) Filed: Jun. 30, 2017

(51) Int. Cl.
*H02G 3/08* (2006.01)
*H05K 5/02* (2006.01)

(52) U.S. Cl.
CPC ........... *H02G 3/083* (2013.01); *H05K 5/0221* (2013.01)

(58) Field of Classification Search
CPC .............................. H02G 3/083; H05K 5/0221
USPC ........................................................ 174/535
See application file for complete search history.

(56) References Cited

U.S. PATENT DOCUMENTS

| 9,787,074 B1* | 10/2017 | Matsumura | H02G 3/16 |
| 2008/0149387 A1* | 6/2008 | Oda | H05K 7/026 |
| | | | 174/520 |
| 2012/0064741 A1* | 3/2012 | Kawaguchi | H01R 9/226 |
| | | | 439/76.2 |
| 2014/0151112 A1* | 6/2014 | Makino | H02G 3/088 |
| | | | 174/535 |

FOREIGN PATENT DOCUMENTS

JP          2016067090 A      4/2016

* cited by examiner

*Primary Examiner* — Michael F McAllister
(74) *Attorney, Agent, or Firm* — Honigman Miller Schwartz and Cohn LLP (57) ABSTRACT

A junction box assembly and a retaining system configured to facilitate access to the eyelet terminal and the bottom housing assembly is provided. The junction box assembly includes a top cover removably attached to the bottom housing assembly. The bottom housing assembly includes an eyelet terminal for receiving an electric connection. An eyelet terminal cover covers the eyelet terminal. The retaining system is configured to removably retain the eyelet terminal cover to the top cover. The retaining system includes a locking structure disposed on the top cover. A key is configured to releasably engage the locking structure. A tether may be secured to the key on a first end and the eyelet terminal cover on a second end so as to allow the eyelet terminal cover to be coupled to the top cover or the eyelet terminal cover to be removed from the top cover.

18 Claims, 9 Drawing Sheets

JUNCTION BOX ASSEMBLY WITH EYELET TERMINAL COVER RETENTION SYSTEM AND REMOVABLE EYELET TERMINAL COVER

TECHNICAL FIELD

The present specification generally relates to junction box assemblies, and more particularly electric junction box assemblies configured to retain an eyelet terminal cover.

BACKGROUND

In general, electric junction box assemblies include a junction box for storing electric components. The electric junction box includes a bottom housing assembly and a top cover. The electric components may be disposed in the bottom housing assembly and covered by the top cover. The electric components are configured to power and control electronic devices. The electric components illustratively include a bus bar, relays, switches and a controller for controlling electric devices. For instance, the electric junction box assemblies may be used in an automotive vehicle to control and power the actuation of electronic devices such as windshield wipers, fans for the HVAC system, mirrors or the like.

Figure 1A:
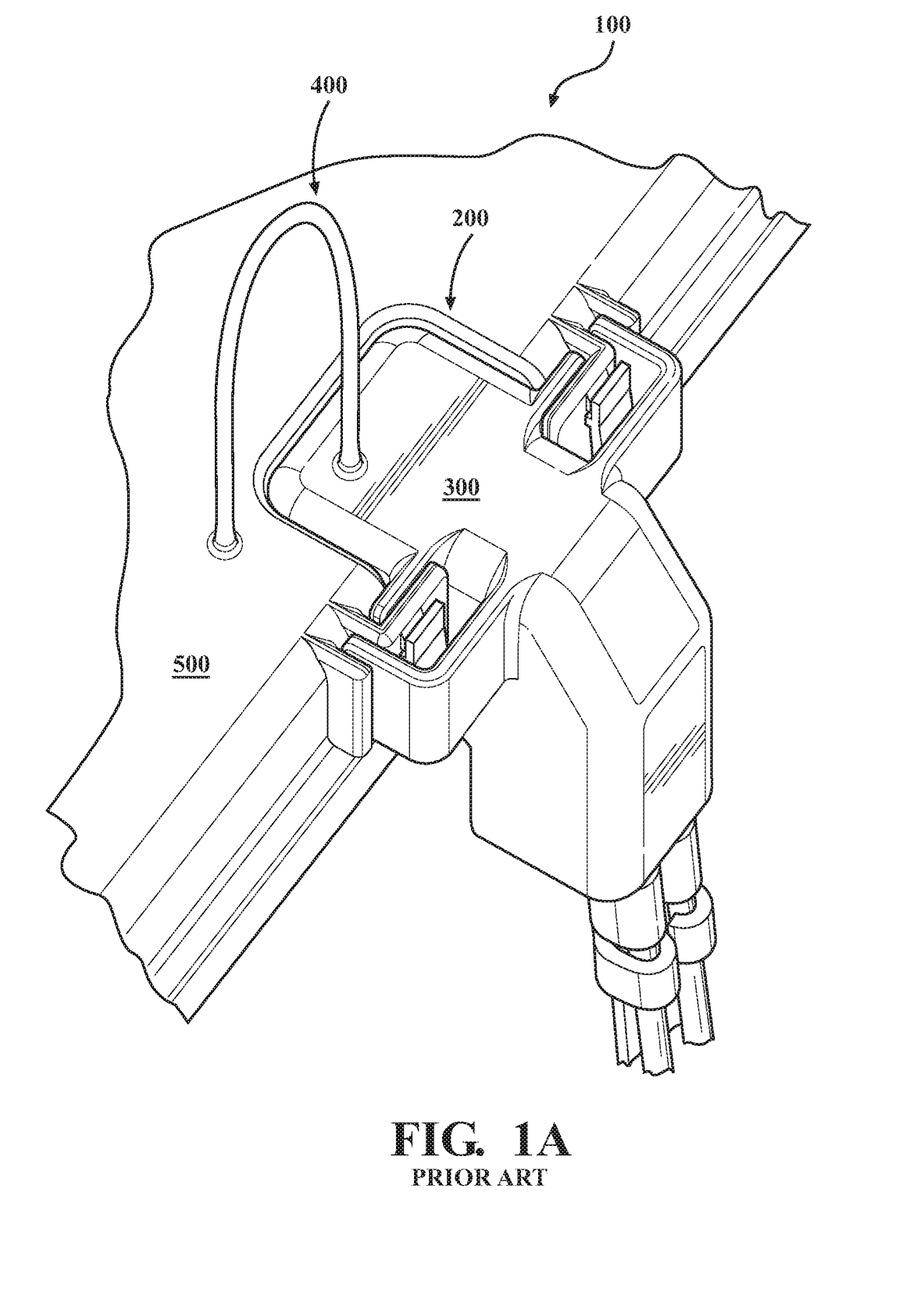
FIG. 1A schematically depicts a prior art retaining system and a junction box assembly.
Figure 1B:
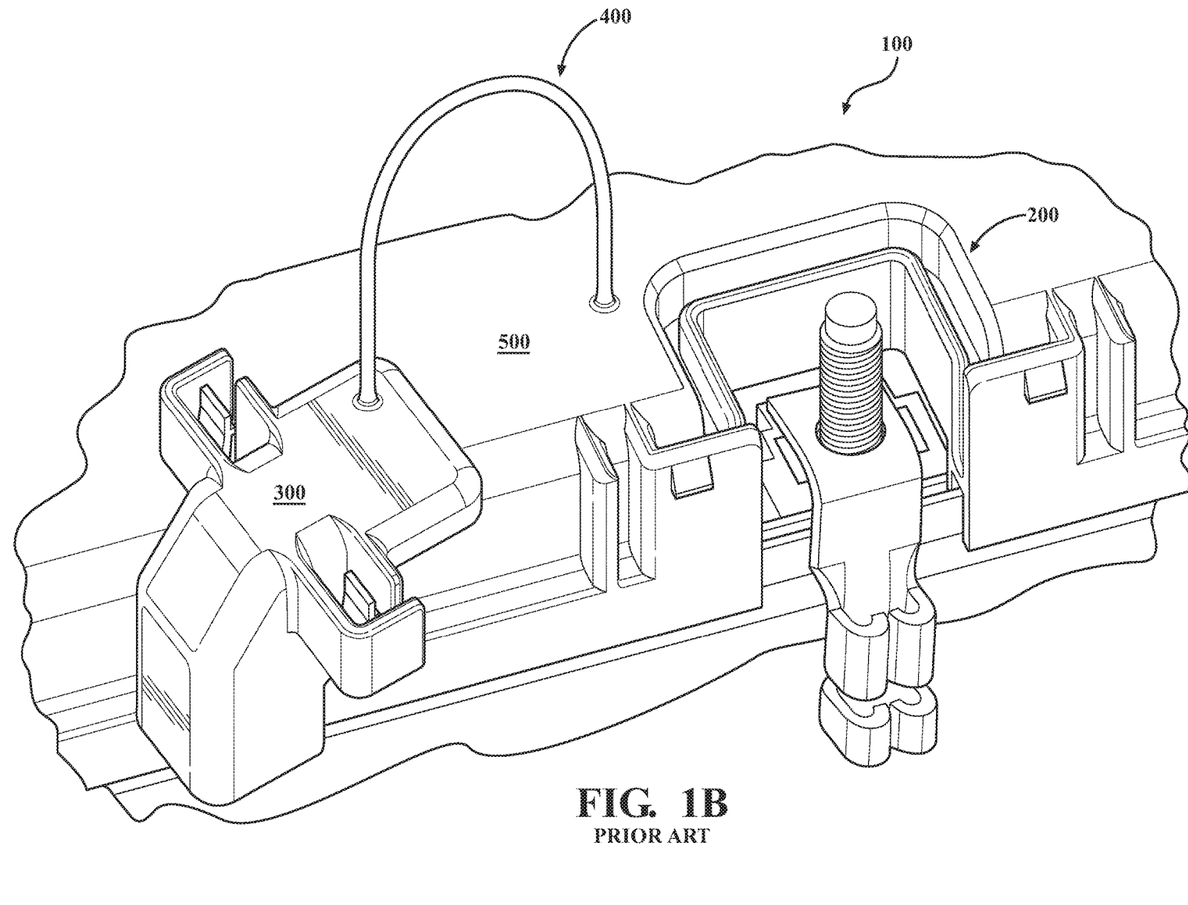
FIG. 1B is a view of FIG. 1A showing the eyelet terminal cover removed from the eyelet terminal.

With reference now to FIGS. 1A and 1B an illustration of an electric junction box assembly 100 of the prior art is shown. The electric junction box assembly 100 may include an eyelet terminal 200. The eyelet terminal 200 may be used to provide power to the electric components. The eyelet terminal 200 may be covered by an eyelet terminal cover 300. It is known to use a tether 400 to secure the eyelet terminal cover to the electric junction box assembly 100, as shown in FIGS. 1A and 1B. Accordingly, the eyelet terminal cover 300 may be removed from a top cover 500 of the junction box assembly 100 and is retained by the tether 400 as shown in FIG. 1B.

The electric junction box may be housed under the hood of the automotive vehicle where packaging space is limited. However, there may be instances where the electric components may need to be accessed or where the electric connection to the eyelet terminal must be disengaged to perform maintenance. Currently, in such situations, the eyelet terminal cover remains tethered to the top cover and thus may be subjected to inadvertent loads causing the tether to break. Further, as the eyelet terminal cover may get in the way during maintenance as it remains fixed to the top cover.

Accordingly, it remains desirable to have an electronic junction box assembly wherein the eyelet terminal cover may be completely disengaged from the top cover. It further remains desirable to have a retaining system with a certain amount of redundancy to help ensure that the tether is functional to retain the eyelet terminal cover to the top cover.

SUMMARY

In one embodiment, a retaining system for use with a junction box assembly is provided. The junction box assembly includes a top cover removably attached to a bottom housing assembly. The bottom housing assembly includes an eyelet terminal and an eyelet terminal cover. The eyelet terminal is configured to receive an electric connection. The eyelet terminal cover is configured to cover the eyelet terminal.

The retaining system includes a locking structure disposed on the top cover. A key is configured to releasably engage the locking structure. A tether secures the key to the eyelet terminal cover.

A junction box assembly is configured to facilitate access to the eyelet terminal and the bottom housing assembly is provided. The junction box assembly includes a top cover removably attached to the bottom housing assembly. The bottom housing assembly includes an eyelet terminal for receiving an electric connection. The junction box assembly includes an eyelet terminal cover. The eyelet terminal cover is configured to cover the eyelet terminal.

The junction box assembly further includes a retaining system configured to removably retain the eyelet terminal cover to the top cover. The retaining system includes a locking structure disposed on the top cover. A key is configured to releasably engage the locking structure. A tether may be secured to the key on a first end and the eyelet terminal cover on a second end so as to allow the eyelet terminal cover to be coupled to the top cover or the eyelet terminal cover to be removed from the top cover.

In one embodiment of the retaining system and the junction box assembly, the tether includes a first strand spaced apart from a second strand, wherein the first end of the first and second strands are attached to the key and the second end of the first and second strands are attached to the top cover. The first and second strands providing redundancy to help ensure that the tether is functional to retain the eyelet terminal cover to the top cover.

Accordingly, the retaining system allows the eyelet terminal cover to be completely disengaged from the top cover. Further, the retaining system and the junction box assembly are configured with redundancy to help ensure that the tether is functional to retain the eyelet terminal cover to the top cover.

BRIEF DESCRIPTION OF THE DRAWINGS

The embodiments set forth in the drawings are illustrative and exemplary in nature and not intended to limit the subject matter defined by the claims. The following description of the illustrative embodiments can be understood when read in conjunction with the following drawings, where like structure is indicated with like reference numerals and in which:

DETAILED DESCRIPTION

Referring generally to the figures, embodiments of the present disclosure include a retaining system for use with a junction box assembly. The retaining system includes a locking structure disposed on a top cover of the junction box assembly. The retaining system further includes a key configured to releasably engage the locking structure. The retaining system further includes a tether configured to secure the key to the eyelet terminal cover. Accordingly, the user may remove the eyelet terminal cover from the top cover by simply disengaging the key from the locking structure so as to facilitate the maintenance of the junction box assembly.

Embodiments of the present disclosure further include a junction box assembly with a retaining system. The junction box assembly includes a top cover removably coupled to a bottom housing assembly. An eyelet terminal is disposed on the bottom housing assembly and an eyelet terminal cover is configured to releasably cover the eyelet terminal.

The retaining system is configured to removably retain the eyelet terminal cover to the top cover. The retaining system includes a locking structure disposed on the top cover. A key is configured to releasably engage the locking structure. A tether may be secured to the key on a first end and the eyelet terminal cover on a second end so as to allow the eyelet terminal cover to be coupled to the top cover or the eyelet terminal cover to be removed from the top cover.

As used herein the terms front and back are made in reference to the orientation of the related part when the retaining system is assembled, wherein the front refers to the portion of the part facing the other during assembly and the back refers to the portion of the part facing away from the front. The term top and down refer to the orientation of the part as shown in the figures.

Figure 2:
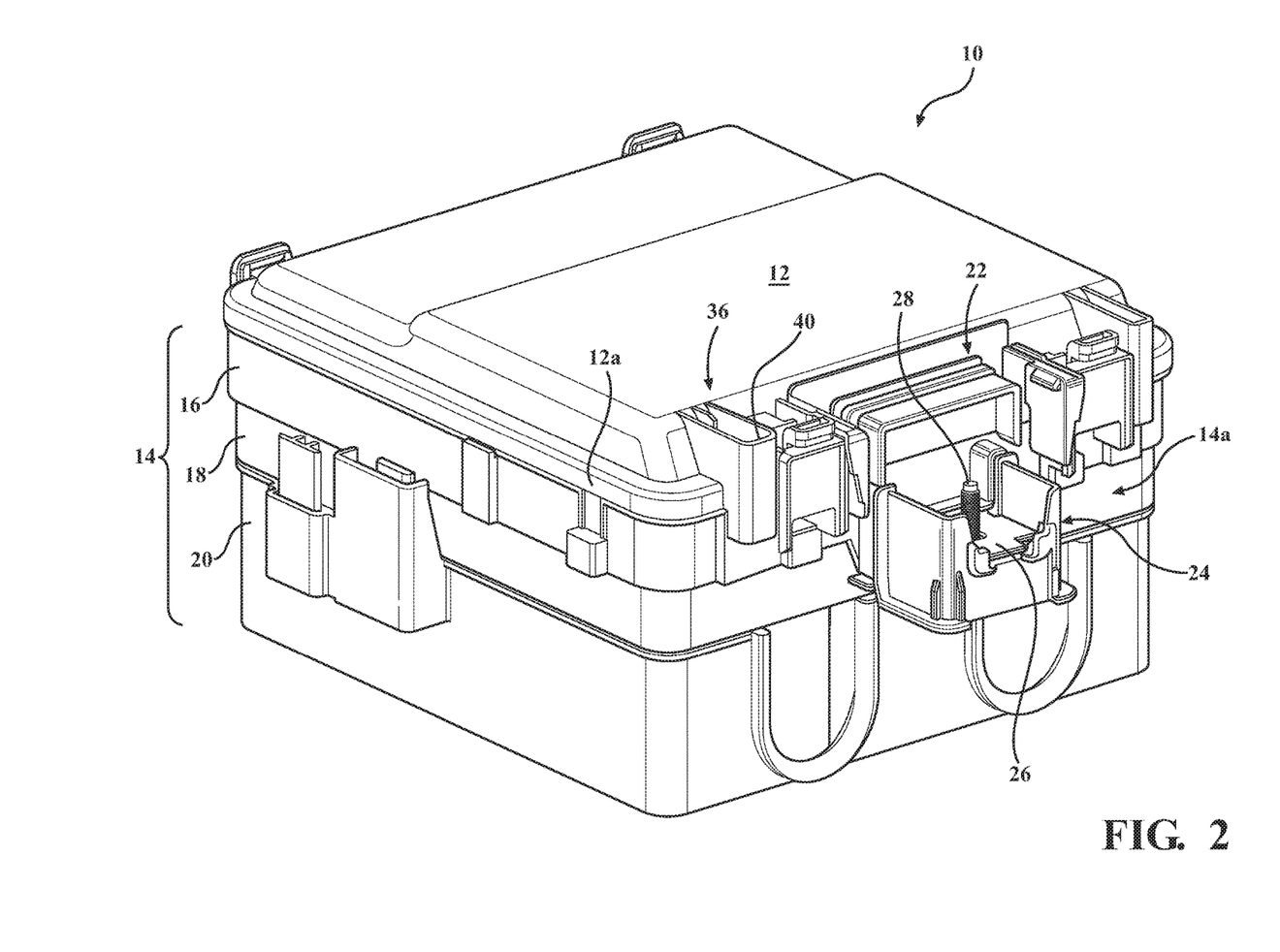
FIG. 2 schematically depicts a retaining system and a junction box assembly according to one or more embodiments described and illustrated herein with the eyelet terminal exposed.

With reference first to FIG. 2 a junction box assembly 10 in accordance with one or more embodiments described herein is provided. The junction box assembly 10 includes a top cover 12 removably attached to a bottom housing assembly 14. The bottom housing assembly 14 may include a top housing 16, an intermediate housing 18 and a bottom cover 20. The top housing 16, intermediate housing 18 and bottom cover 20 may be releasably attached to each other. The junction box assembly 10 is configured to house electric components (not shown). It should be appreciated that the shape and design of the top cover 12 and the bottom housing assembly 14 may be modified from what is shown herein without deviating from the scope of the appended claims.

The electric components are configured to power and control electronic devices. The electric components illustratively include a bus bar, relays, switches and a controller for controlling electric devices. For instance, the electric junction box assemblies may be used in an automotive vehicle to control and power the actuation of electronic devices such as windshield wipers, fans for the HVAC system, mirrors or the like.

With again to FIG. 3, the junction box assembly 10 is shown with an eyelet terminal 22 exposed. The eyelet terminal 22 may be disposed on a front wall 14a of the bottom housing assembly 14. The eyelet terminal 22 includes a terminal support 24. The terminal support 24 is illustratively shown disposed on an outer surface of the front wall 14a and being generally box shaped.

Figure 3:
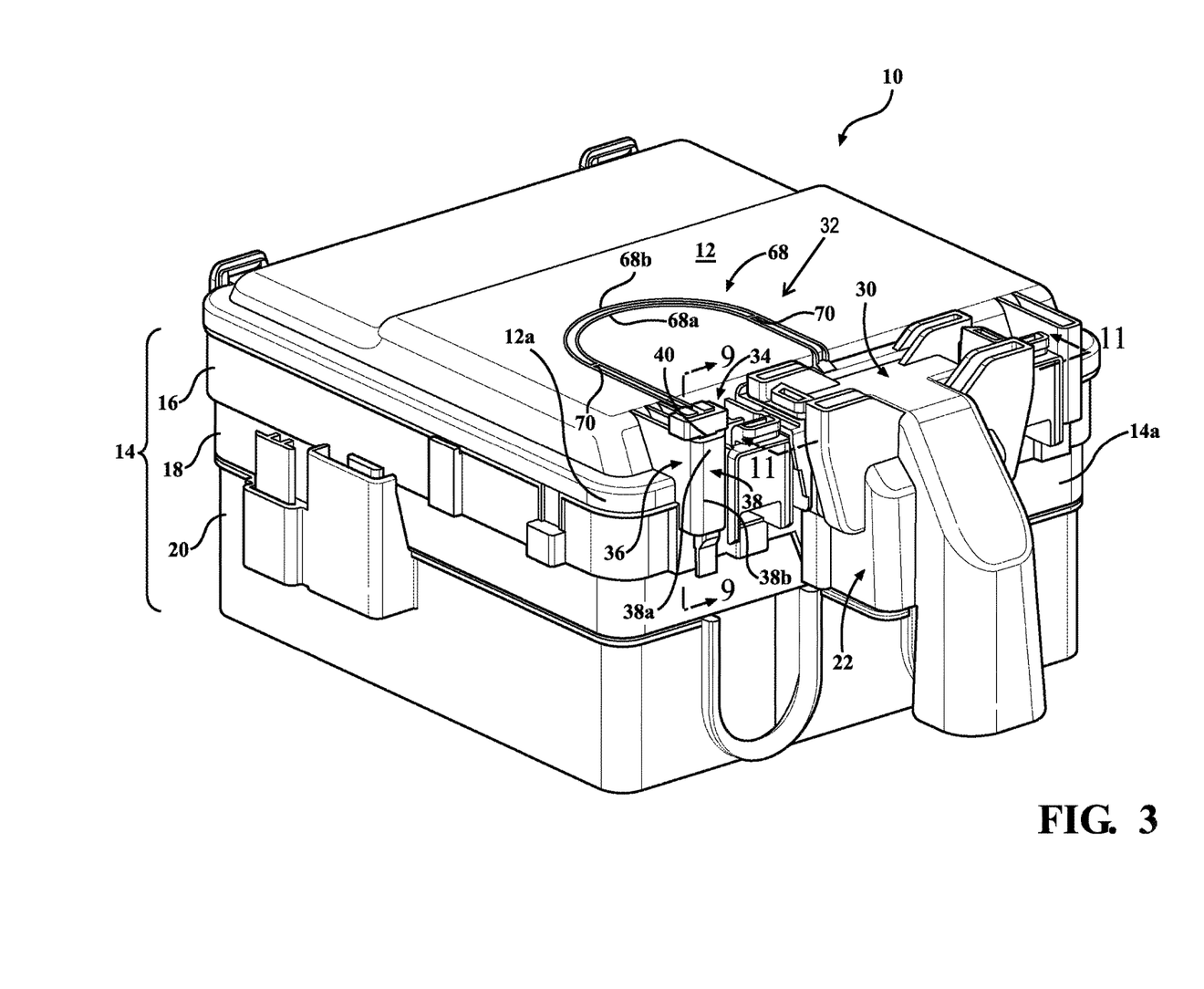
FIG. 3 is a view of FIG. 2 with eyelet terminal cover covering the eyelet terminal.

The terminal support 24 includes a conductive base 26 having a bore through which a post 28 extends through. The post 28 and the conductive base 26 may be made of an electrically conductive material and is configured to receive a terminal connection (not shown) for supplying power to the electric components. The conductive base 26 may be connected to a bus bar (not shown) so as to route power to various electric components.

With now to FIG. 3, the eyelet terminal 22 is covered by an eyelet terminal cover 30. The eyelet terminal cover 30 is configured to be releasably engaged to the eyelet terminal support 24. Accordingly, the junction box assembly 10 may be configured in such a manner that the top cover 12 remains coupled to the bottom housing assembly 14 and the eyelet terminal cover 30 is removed from the eyelet terminal 22 so as to facilitate the assembly of the connection of a power source after the junction box assembly 10 has been installed into its intended platform, such as an automotive vehicle (not shown). An embodiment of an eyelet terminal cover 30 is illustratively shown herein; however it should be appreciated that the eyelet terminal cover 30 and eyelet terminal 22 may be modified in a manner other than what is shown herein without deviating from the scope of the appended claims.

Figure 6:
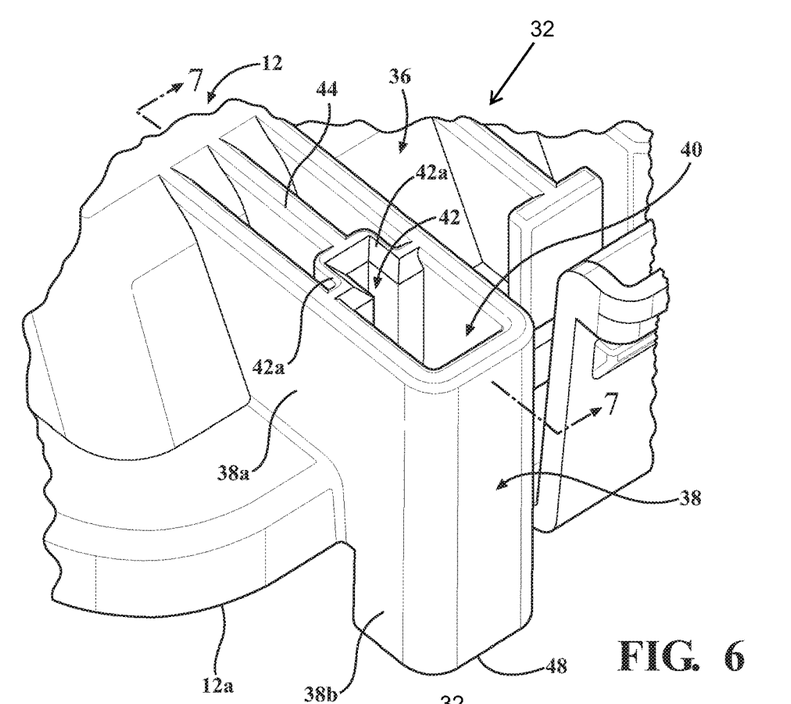
FIG. 6 is an isolated view of a locking structure according to one or more embodiments described and illustrated herein.
Figure 7:
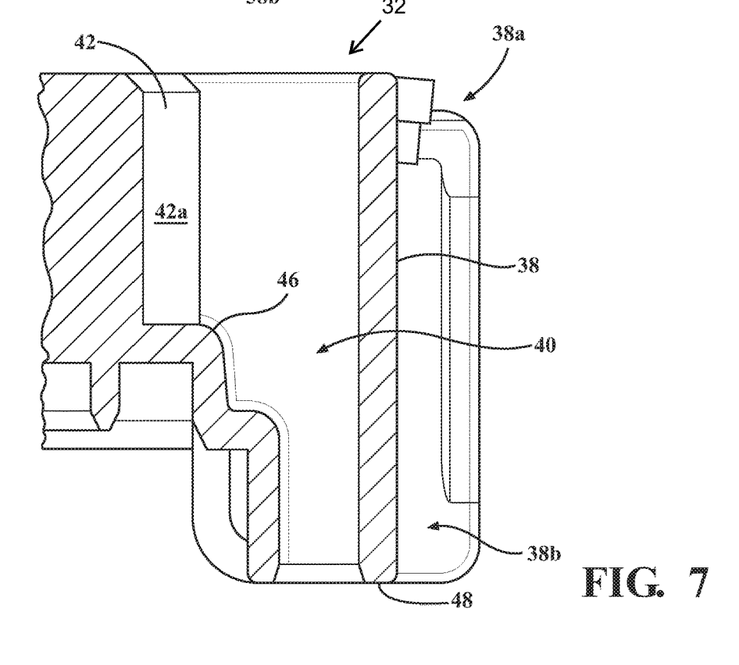
FIG. 7 is a cross sectional view of FIG. 6 taken along line 7-7.

With reference again to FIG. 3 and now to FIGS. 6 and 7, the junction box assembly 10 further includes a retaining system 32. The retaining system 32 is configured to retain a key 34 to the eyelet terminal cover 30. The retaining system 32 may be further configured to retain the key 34 to the top cover 12.

In one embodiment, the retaining system 32 includes a locking structure 36 disposed on the top cover 12. The locking structure 36 is illustratively shown as being integrally formed to a top of a side wall of the top cover 12. The locking structure 36 may be formed with the top cover 12 as a single piece through an injection molded process. Alternatively, the locking structure 36 may be formed as a separate piece with mating features configured to engage complimentary mating features of the top cover 12.

In one embodiment, the locking structure 36 includes a locking wall 38. An upper portion 38a of the locking wall 38 is disposed on a top surface of the top cover 12 and a bottom portion 38b of the locking wall 38 extends beneath a lip 12a of the top cover 12. The locking wall 38, both the upper portion 38a and the bottom portion 38b, bound a passage 40. The passage 40 extends along an axis oriented from the top of the top cover 12 to the bottom of the top cover 12.

The locking structure 36 may further include a slot 42 extending along a portion of an axis of the passage 40. In one embodiment, the slot 42 is centered on the passage 40. The slot 42 is formed by a pair of sidewalls 42a formed on the interior of the passage 40. The sidewalls 42a are spaced apart from each other and extend downwardly to predetermined depth so as to define a slot 42 shorter in length than the passage 40 (as shown in FIG. 7). A reinforcing rib 44 may be formed on the back side of the locking wall 38 and generally centered between opposite surfaces of the locking wall 38.

With reference now to FIG. 7, a cross-sectional view of the locking structure 36 shown in FIG. 6 taken along lines 7-7 is provided. The inner space of the passage 40 is shown. The slot 42 is shown disposed along a back portion of the passage 40. A ledge 46 defines the bottom limit of the slot 42. The bottom portion of the passage 40 is generally uniform in width and is open so as to define a bottom edge 48.

Figure 4:
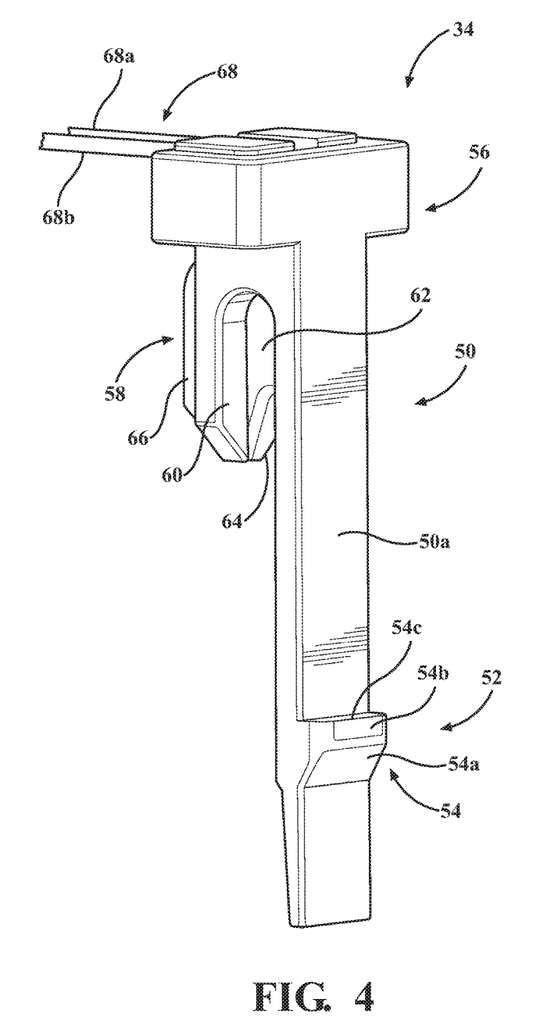
FIG. 4 is an isolated view of a key according to one or more embodiments described and illustrated herein.
Figure 5:
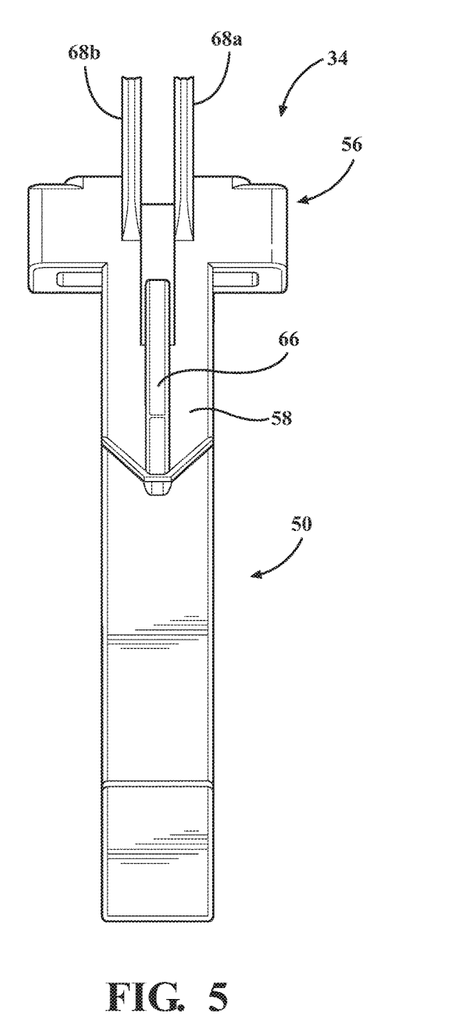
FIG. 5 is a view of the key shown in FIG. 4 taken from the back.

With reference again to FIG. 3 and now to FIGS. 4 and 5, an isolated view of the key 34 is provided. It should be appreciated that the key 34 shown in FIGS. 4 and 5 are provided for illustrative purposes and may be modified without deviating from the scope of the appended claims. In one embodiment, the key 34 includes an elongated member 50. The key 34 may be formed of a resilient material formed from injection molding such as polypropylene.

The key 34 includes a catch 52 disposed on a distal end of the elongated member 50. The catch 52 is configured to releasably engage the locking structure 36. The catch 52 is spaced above a distal end of the elongated member 50. In one embodiment, the catch 52 includes a ramp shaped surface 54 disposed on a front face 50a of the elongated member 50. The ramp shaped surface 54 has an angled surface 54a extending outwardly from the front face 50a of the elongated member 50. A planar front face 54b is disposed above the angled surface 54a, the planar front face 54b presenting a plane generally parallel to the front face 50a of the elongated member 50. A top surface 54c of the catch 52 is generally orthogonal to the planar front face 54b so as to provide a surface for engaging a lower edge of the locking structure 36.

The key 34 may further include a top portion 56 having a base 58. The elongated member 50 extends from the base 58. The elongated member 50 is a generally rectangular member with a pointed end. The base 58 includes a bottom wall 60 spaced apart from the elongated member 50. A thin panel 62 interconnects the backside of the elongated member 50 with the back side of the bottom wall 60. The base 58 may further include a recess 64; the recess 64 is formed on the panel 62 and is generally shaped as an inverted "V". The recess 64 may be provided to add a predetermined amount of resiliency to the elongated member 50.

The base 58 may further include a fin 66. The fin 66 is a relatively thin planar member extending generally orthogonal to a back surface of the base 58. The fin 66 may include a tapered bottom end so as to facilitate insertion of the fin 66 into the slot 42 of the locking structure 36. The fin 66 may be generally centered with respect to the base 58. The fin 66 is configured to assist with seating the key 34 into the passage 40 by introduction of the fin 66 into the slot 42.

With reference again to FIG. 3, the retaining system 32 further includes a tether 68. In one embodiment, the tether 68 is attached to the top portion 56 of the key 34 on one end and the eyelet terminal cover 30 on the other end. The tether 68 may be formed as a pliable and resilient material, illustratively including polypropylene, leather or rubber. In one embodiment, the tether 68 includes a first strand 68a spaced apart from a second strand 68b. The first and second strands 68a, 68b may be formed to have a generally arcuate profile. The tether 68 may further include at least one cross support 70. The cross support 70 connects the first strand 68a to the second strand 68b. Thus, the tether 68 may be formed to have redundancy in that should one strand break; the other strand remains intact to maintain the connection between the key 34 and the eyelet terminal cover 30.

An operation of the junction box assembly 10 and retaining system 32 is provided with reference to FIGS. 3, and 6-9. FIG. 3 shows the junction box assembly 10 fully assembled. In particular, the eyelet terminal cover 30 is seated to the eyelet terminal 22 and the key 34 is engaged in the locking structure 36. The tether 68 connects the key 34 to the eyelet terminal cover 30.

Figure 8:
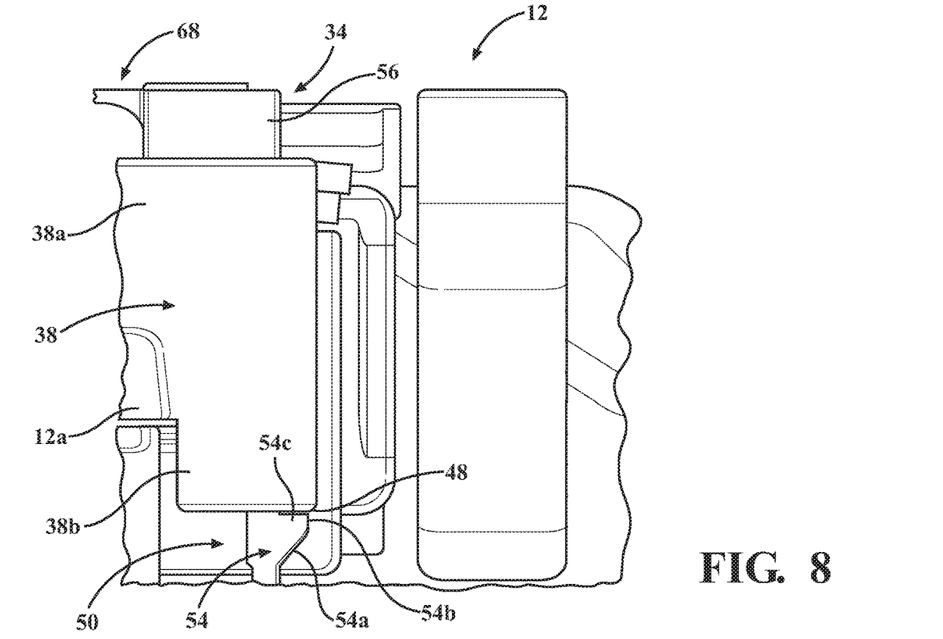
FIG. 8 is a side view of the retaining system and junction box assembly showing the key engaged in the locking structure.

FIG. 8 is a side view showing the key 34 engaged with the locking structure 36 in isolation. The elongated member 50 is shown disposed within the passage 40 and the catch 52 is shown engaged with the bottom edge 48 of the passage 40. In particular, the ramp shaped surface 54 of the catch 52 is disposed beneath the bottom edge 48 of the passage 40. The top surface 54c is pressed into engagement with the bottom edge 48 so as to prevent the user from pulling the key 34 out of the passage 40.

Insertion of the key 34 into the passage 40 of the locking structure 36 is done by simply pushing the elongated member 50 into the passage 40, wherein the fin 66 is registered to engage the slot 42 centering the elongated member 50 within the passage 40. As the key 34 is slid into the passage 40, the angled surface 54a pushes the elongated member 50 into the passage 40 as a result of the resiliency of the elongated member 50 and also the recess 64. Once the planar front face 54b clears the bottom edge 48 of the passage 40, the resiliency of the elongated member 50 biases the elongated member 50 outwardly, wherein the top surface 54c of the catch 52 engages the bottom edge 48 of the passage 40 securing the key 34 within the locking structure 36.

Figure 9:
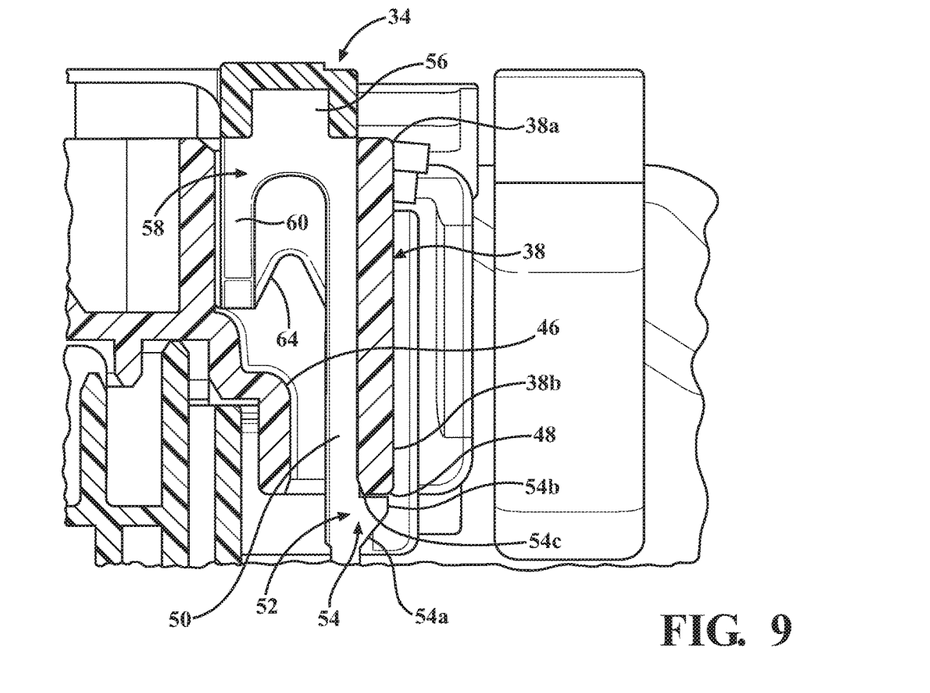
FIG. 9 is a cross sectional view of FIG. 3 taken along line 9-9.

With reference now to FIG. 9, an illustration of the removal of the key 34 is provided. FIG. 9 is a cross-sectional view of FIG. 3 taken along lines 9-9. The distal end of the elongated member 50 may be pushed into the passage 40. The elongated member 50, being resilient, works in concert with the recess 64 so as to allow the elongated member 50 to flex inwardly a sufficient amount so as to disengage the top surface 54c of the catch 52 from the bottom edge 48 of the passage 40. The elongated member 50 may then be pushed upwardly wherein the planar front face 54c of the catch 52 slides against the inner walls of the locking wall 38 so as to allow the key 34 to be removed.

Figure 10:
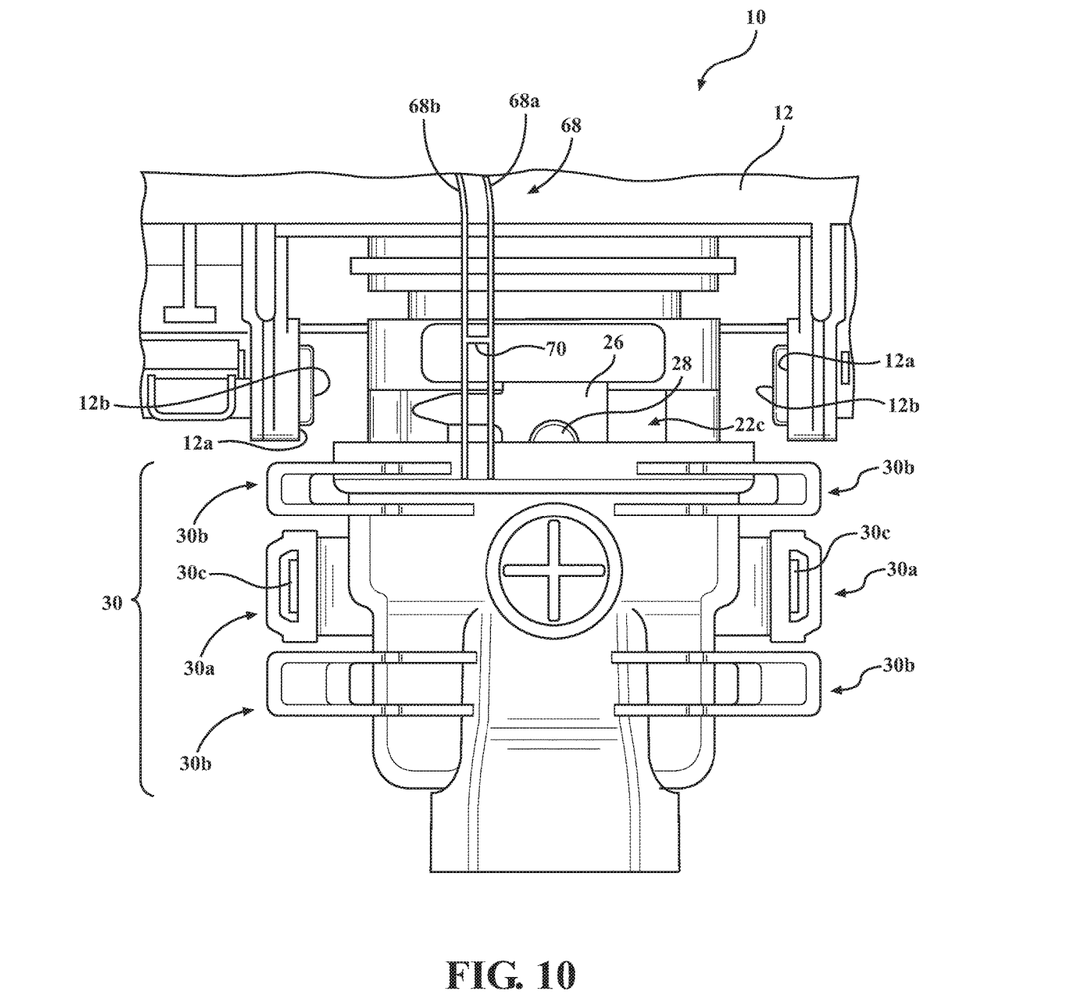
FIG. 10 is a top down view showing the eyelet terminal cover being removed from the eyelet terminal.

In one instance, it may be desirable to access the eyelet terminal 22. For instance, power to the junction box assembly 10 may need to be disconnected for servicing or maintenance purposes. FIG. 10 shows depicts the removal of the eyelet terminal cover 30 from the eyelet terminal 22 and illustrates how the eyelet terminal cover 30 is retained to the key 34 by the tether 68. In instances where the junction box assembly 10 is already installed in an automotive vehicle, packaging space and workspace may be limited and thus the eyelet terminal cover 30 is allowed to simply dangle from the top cover 12 vis-à-vis the tether 68. Thus, the assembly worker need not hold onto the eyelet terminal cover 30 nor find a place in the limited workspace to set the eyelet terminal cover 30 down. Further, the top cover 12 remains attached to the bottom housing assembly 14 so as to maintain protection of the electric components housed therein.

In one instance it may be desirable to remove the top cover 12 from the bottom housing assembly 14. For instance, the assembly worker may have to service the electric components within the junction box assembly 10. In such an instance, the user may simply disengage the eyelet terminal cover 30 from the eyelet terminal 22 and the top cover 12 may be removed from the bottom housing assembly 14. The eyelet terminal 22 and the bottom housing assembly 14 are exposed. The assembly worker may then remove the key 34 from the top cover 12 and place the eyelet terminal cover 30 over the eyelet terminal 22 so as to keep the eyelet terminal covered while work is performed on the electric components housed in the bottom housing assembly 14.

Accordingly, the retaining system 32 allows the eyelet terminal cover 30 to be completely disengaged from the top cover 12. Further, the retaining system 32 and the junction box assembly 10 are configured with redundancy to help ensure that the tether 68 is functional to retain the eyelet terminal cover 30 to the top cover 12.

Embodiments of the present disclosure further include a junction box assembly having an eyelet terminal cover configured to releasably cover the eyelet terminal, wherein the eyelet terminal cover may be detached from the eyelet terminal in a manner wherein the eyelet terminal cover does not have to vertically clear the eyelet terminal.

Figure 11:
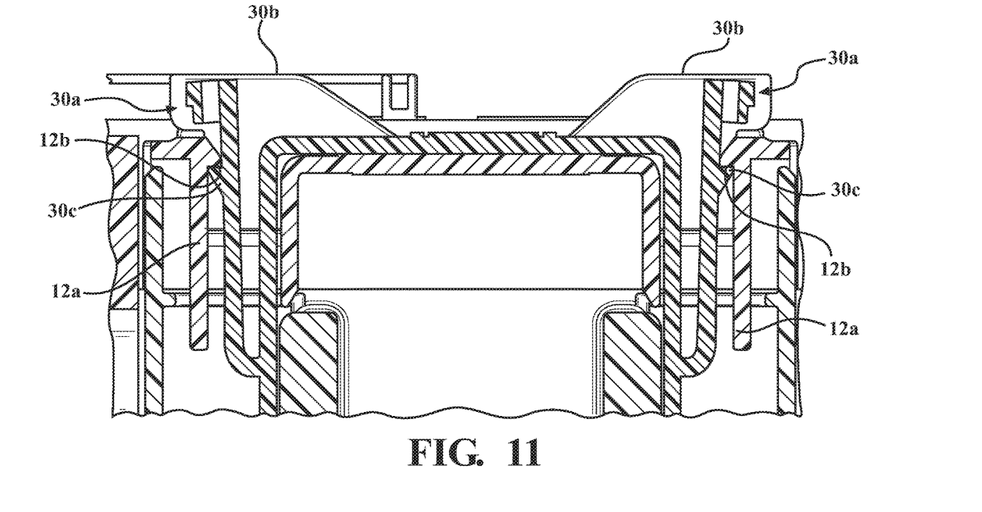
FIG. 11 is a cross-sectional view of FIG. 3 taken along lines 11-11.
Figure 12:
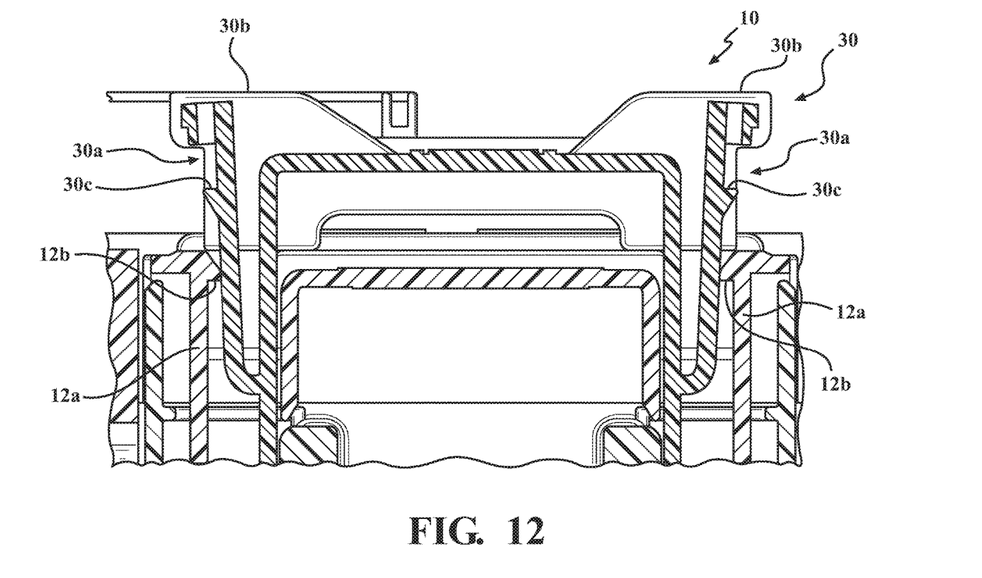
FIG. 12 is a view of FIG. 11 showing the eyelet terminal cover covering the eyelet terminal.

With reference again to FIGS. 2 and 3, and now to FIGS. 10-12, the top cover 12 includes side walls 12a with a retaining feature 12b. In one embodiment, the retaining feature 12b is a ramp shaped feature with a planar bottom surface. The side walls 12a are disposed on a front side of the top cover and are spaced apart from each other so as to accommodate the eyelet terminal cover 12. The side walls 12a are generally orthogonal to the front side of the tope cover 12. The eyelet terminal 22 is disposed beneath the bottom edge of the side walls 12a.

The eyelet terminal cover 30 includes elongated resilient tabs 30a disposed on opposite ends on the eyelet terminal cover 30. FIGS. 11 and 12 show an embodiment of the elongated resilient tabs 30a. The tabs 30a are integrally formed to opposing sides of the terminal cover 30 and are disposed between a pair of gripping features 30b. The resilient tabs 30a include a lip 30c disposed beneath a top edge of the respective tabs 30a. The lips 30c are configured to engage the retaining feature 12b of the side walls 12a. The gripping features 30b are generally block shaped members and the front gripping features generally shield the tabs 30a when the terminal cover 30 covers the eyelet terminal 22, as shown in FIG. 2.

FIG. 11 is a cross-sectional view of FIG. 3 taken along line 11-11. FIG. 11 shows the resilient tabs 30a engaged with respective retaining features 12b of respective side walls 12a. The tabs 30a are seated beneath the retaining features, which prevent the terminal cover 30 from being pulled up. The side walls 12a are saddled between respective gripping features 30b so as to prevent the eyelet terminal cover 30 from being pulled out of the eyelet terminal 22 when the tabs 30a are engaged with respective retaining features 12b.

In operation, the eyelet terminal cover 30 is seated into the eyelet terminal 22 wherein the eyelet terminal cover 30 is generally centered above the eyelet terminal 22. The eyelet terminal cover 30 is then push down, wherein the side walls 12a are saddled between respective gripping features 30b. As the eyelet terminal cover 30 is pushed down, the resilient tabs 30a are pressed inwardly by the retaining features 12b of the side walls 12a until a catch 12c of the resilient tabs 30a push past the retaining features 12b. In such a manner the eyelet terminal cover 30 is locked into engagement so as to cover the eyelet terminal 22.

Removing the eyelet terminal cover 30 may be done by simply squeezing the resilient tabs 30a together, wherein the lips 30c are displaced inwardly and free of respective retaining features 12b of the side walls 12a. The eyelet terminal cover 30 may be lifted up wherein the bottom edges of the gripping features 30b are clear of the side walls 12a and the eyelet terminal cover 30 may then be pulled out of the eyelet terminal 22. Accordingly, the entirety of the eyelet terminal cover 30 need not be pulled out and clear of the eyelet terminal 22 to access the eyelet terminal 22.

Accordingly, the junction box assembly 10 may be configured in such a manner that the top cover 12 remains coupled to the bottom housing assembly 14 and the eyelet terminal cover 30 is removed from the eyelet terminal 22 so as to facilitate the assembly of the connection of a power source after the junction box assembly 10 has been installed into its intended platform, such as an automotive vehicle (not shown). An embodiment of an eyelet terminal cover 30 is illustratively shown herein; however it should be appreciated that the eyelet terminal cover 30 and eyelet terminal 22 may be modified in a manner other than what is shown herein without deviating from the scope of the appended claims.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A retaining system for use with a junction box assembly, the junction box assembly having a top cover removably attached to a bottom housing assembly, the bottom housing assembly having an eyelet terminal for receiving an electric connection, and an eyelet terminal cover configured to cover the eyelet terminal, the retaining system comprising:
 a locking structure disposed on the top cover;
 a key configured to releasably engage the locking structure; and
 a tether having a first end opposite a second end, wherein the first end is secured to the key and the second end is secured to the eyelet terminal cover so as to allow the eyelet terminal cover to be coupled to the top cover or the eyelet terminal cover to be removed from the top cover.

2. The retaining system of claim 1, wherein the locking structure includes a locking wall bounding a passage, the passage configured to receive the key.

3. The retaining system of claim 2, wherein the locking structure includes a slot extending along a portion of an axis of the passage.

4. The retaining system of claim 1, wherein the key is an elongated member having a catch disposed on a distal end of the elongated member, the catch configured to releasably engage the locking structure.

5. The retaining system of claim 4, wherein the key includes a top portion having a base, the elongated member extending from the base.

6. The retaining system of claim 5, wherein the base includes a recess configured to facilitate a flex of the elongated member relative to the base.

7. The retaining system of claim 5, wherein the locking structure includes a slot and a locking wall bounding a passage, the passage configured to receive the key, the slot extending along a portion of an axis of the passage and the base further includes a fin, the fin configured to seat within the slot so as to facilitate the engagement of the key within the locking structure.

8. The retaining system of claim 5, wherein the tether is attached to the top portion of the key.

9. The retaining system of claim 8, wherein the tether includes a first strand spaced apart from a second strand.

10. The retaining system of claim 9, wherein the tether further includes at least one cross support, the at least one cross support connecting the first strand to the second strand.

11. A junction box assembly, the junction box assembly having a top cover removably attached to a bottom housing assembly, the bottom housing assembly having an eyelet terminal for receiving an electric connection, the junction box assembly comprising:

an eyelet terminal cover; and retaining system configured to removably retain the eyelet terminal cover to the top cover, the retaining system including a locking structure disposed on the top cover, a key configured to releasably engage the locking structure, and a tether secured to the key on a first end and the eyelet terminal cover on a second end so as to allow the eyelet terminal cover to be coupled to the top cover or the eyelet terminal cover to be removed from the top cover.

12. The junction box assembly of claim 11, wherein the locking structure includes a locking wall bounding a passage, the passage configured to receive the key and wherein the locking structure includes a slot extending along a portion of an axis of the passage.

13. The junction box assembly of claim 11, wherein the key is an elongated member having a catch disposed on a distal end of the elongated member, the catch configured to releasably engage the locking structure and wherein the key includes a top portion having a base, the elongated member extending from the base.

14. The junction box assembly of claim 13, wherein the base includes a recess configured to facilitate a flex of the elongated member relative to the base, and wherein the locking structure includes a slot and a locking wall bounding a passage, the passage configured to receive the key, the slot extending along a portion of an axis of the passage and the base further includes a fin, the fin configured to seat within the slot so as to facilitate the engagement of the key within the locking structure.

15. The junction box assembly of claim 14, wherein the tether is attached to the top portion of the key, and wherein the tether includes a first strand spaced apart from a second strand and at least one cross support, the at least one cross support connecting the first strand to the second strand.

16. A junction box assembly comprising:

a top cover removably attached to a bottom housing assembly, the top cover having a pair of side walls spaced apart from each other and disposed on a front side of the top cover, each of the pair of side walls includes a retaining feature, the bottom housing assembly having an eyelet terminal for receiving an electric connection;

an eyelet terminal cover having a pair of resilient tabs disposed on opposite ends of the eyelet terminal cover;

the resilient tabs configured to engage a respective retaining feature.

17. The junction box assembly as set forth in claim 16, wherein the eyelet terminal cover further includes a pair of gripping features on each end of the eyelet terminal cover, the resilient tabs being disposed between a respective pair of gripping features.

18. The junction box assembly as set forth in claim 17, wherein each of the pair of resilient tabs include a lip disposed beneath a top edge of the respective resilient tabs, the lip configured to engage the retaining feature.

* * * * *